(12) United States Patent
Li et al.

(10) Patent No.: US 12,477,843 B2
(45) Date of Patent: Nov. 18, 2025

(54) FLAT PANEL DETECTOR AND IMAGING SYSTEM (71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ziyan Li, Beijing (CN); Haonan Li, Beijing (CN); Bo Fu, Beijing (CN); Yonghui Wang, Beijing (CN); Jiaqiang Wang, Beijing (CN); Chen Meng, Beijing (CN); Binghai Zhu, Beijing (CN)

(73) Assignees: BEIJING BOE OPTOELECTRONICS TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/028,425

(22) PCT Filed: Jun. 22, 2022

(86) PCT No.: PCT/CN2022/100335
§ 371 (c)(1),
(2) Date: Mar. 24, 2023

(87) PCT Pub. No.: WO2023/245477
PCT Pub. Date: Dec. 28, 2023

(65) Prior Publication Data
US 2024/0313031 A1 Sep. 19, 2024

(51) Int. Cl.
H01L 23/00 (2006.01)
H01L 21/00 (2006.01)
(Continued)

(52) U.S. Cl.
CPC ....... *H10F 39/1898* (2025.01); *H10F 39/804* (2025.01)

(58) Field of Classification Search
CPC ..... H10F 39/12; H10F 39/804; H10F 39/1898
See application file for complete search history.

(56) References Cited

U.S. PATENT DOCUMENTS

2019/0196032 A1* 6/2019 Horiuchi ................. G01T 1/244
2020/0408938 A1* 12/2020 Iwakiri ................. G01T 1/2023
(Continued)

FOREIGN PATENT DOCUMENTS

| CN | 102783956 A | 11/2012 |
| CN | 110148602 A | 8/2019 |
| CN | 114520239 A | 5/2022 |

*Primary Examiner* — Mark R Gaworecki
(74) *Attorney, Agent, or Firm* — Nath, Goldberg & Meyer; Joshua B. Goldberg (57) ABSTRACT

A flat panel detector and an imaging system are disclosed. The flat panel detector includes: a main housing including a bottom wall and a side wall connected to the bottom wall, the bottom wall and the side wall defining an accommodating space; and a detection module in the accommodating space, the detection module including a support plate, a detection substrate, a driving circuit board, and a flexible circuit board, where the support plate includes a support surface and a bottom surface opposite to each other and a side surface connected therebetween, the detection substrate is fixed on the support surface, the driving circuit board is fixed on the support plate and is on a side of the support plate away from the detection substrate, and the flexible circuit board connects the detection substrate with the driving circuit board by passing the side surface of the support plate.

20 Claims, 8 Drawing Sheets (51) Int. Cl.
*H01L 23/02* (2006.01)
*H10F 39/00* (2025.01)
*H10F 39/18* (2025.01)

(56) References Cited

U.S. PATENT DOCUMENTS

2021/0330277 A1   10/2021   Scott et al.
2021/0373182 A1*  12/2021   Kyushima ............... H10F 39/80

* cited by examiner

FLAT PANEL DETECTOR AND IMAGING SYSTEM

This is a National Phase Application filed under 35 U.S.C. 371 as a national stage of PCT/CN2022/100335, filed Jun. 22, 2022, the content of each of which is hereby incorporated by reference in its entirety.

TECHNICAL FIELD

The present disclosure relates to the field of photoelectric detection technology, in particular to a flat panel detector and an imaging system.

BACKGROUND

The X-Ray detection technology is widely applied to the fields of industrial non-destructive test, container scanning, circuit board inspection, medical treatment, security protection, industry or the like, and has wide application prospects. The X-ray digital imaging technology adopts an X-ray flat panel detector to directly convert an X-ray image into a digital image, and has been widely developed and applied because the converted digital image is clear, has a high resolution, and is easy to be stored and transmitted.

SUMMARY

In a first aspect, the present disclosure provides a flat panel detector, including: a main housing including a bottom wall and a side wall connected to the bottom wall, the bottom wall and the side wall defining an accommodating space; and a detection module in the accommodating space, where the detection module includes a support plate, a detection substrate, a driving circuit board, and a flexible circuit board, the support plate includes a support surface and a bottom surface opposite to each other and a side surface connected between the support surface and the bottom surface, the detection substrate is fixed on the support surface, the driving circuit board is fixed on the support plate and is on a side of the support plate away from the detection substrate, and the flexible circuit board connects the detection substrate with the driving circuit board by passing the side surface of the support plate.

In some implementations, a lug is provided at an edge of the support plate, a limiting groove is provided in the side wall of the main housing, and at least a portion of the lug extends into the limiting groove.

In some implementations, a boss is provided in the limiting groove, and includes a fixing surface away from the bottom wall, and the lug is fixed on the fixing surface.

In some implementations, a first fixing hole is provided in the boss; the flat panel detector further includes a first fastening member, an end of the first fastening member is arranged on the lug, and another end of the first fastening member is fixed in the first fixing hole, so as to fix the lug on the fixing surface.

In some implementations, a support pillar is provided on the bottom wall, the driving circuit board is supported on the support pillar, and a second fixing hole is provided in the support pillar; the flat panel detector further includes a fastening assembly passing through the driving circuit board, an end of the fastening assembly is arranged on the support plate, and another end of the fastening assembly is fixed in the second fixing hole.

In some implementations, the fastening assembly includes: a second fastening member, a part of the second fastening member being between the support plate and the driving circuit board, another part of the second fastening member passing through the driving circuit board and being fixed in the second fixing hole, and a third fixing hole being provided in the second fastening member; and a third fastening member, an end of the third fastening member being fixed on the support plate, and another end of the third fastening member being fixed in the third fixing hole.

In some implementations, a fourth fixing hole is provided in the support plate, and an end of the third fastening member is fixed in the fourth fixing hole.

In some implementations, the detection module further includes: a battery fixed on a back surface of the support plate and electrically connected to the driving circuit board.

In some implementations, a reinforcing rib is provided on a surface of the bottom wall facing the accommodating space, and an orthographic projection of the reinforcing rib on the bottom wall does not overlap with an orthographic projection of the driving circuit board on the bottom wall and an orthographic projection of the battery on the bottom wall.

In some implementations, the flat panel detector further includes an auxiliary functional element, at least a part of the auxiliary functional element is fixed in the accommodating space and electrically connected to the driving circuit board; an open pore is provided in the side wall, and the auxiliary functional element is opposite to the open pore.

In some implementations, the flat panel detector further includes a cover plate on a side of the detection module away from the bottom wall of the main housing and connected to the side wall of the main housing.

In some implementations, an accommodating groove is provided in an end of the side wall away from the bottom wall, and surrounds the accommodating space, and a sealing ring is provided in the accommodating groove.

In some implementations, a plurality of grooves are disposed in the side wall, and openings of the plurality of grooves are in an end surface of the side wall away from the bottom wall.

In some implementations, the bottom wall and the side wall of the main housing are of an integrated structure.

The present disclosure further provides an imaging system, including the flat panel detector described above.

BRIEF DESCRIPTION OF DRAWINGS

The accompanying drawings, which are provided for further understanding of the present disclosure and constitute a part of this specification, are for explaining the present disclosure together with the embodiments of the present disclosure, but are not intended to limit the present disclosure.

DETAIL DESCRIPTION OF EMBODIMENTS

The embodiments of the present disclosure will be described more fully hereinafter with reference to the accompanying drawings. It should be understood that the embodiments described here are only intended to illustrate and explain the present disclosure, but are not to limit the present disclosure.

In order to enable the objects, technical solutions and advantages of the embodiments of the present disclosure to be more apparent, the technical solutions of the embodiments of the present disclosure will be clearly and completely described below with reference to the drawings of the embodiments of the present disclosure. It is to be understood that the described embodiments are only a few, not all, of embodiments of the present disclosure. All other embodiments, which can be derived by a person skilled in the art from the described embodiments of the present disclosure without creative works, are within the scope of protection of the present disclosure.

Unless defined otherwise, technical or scientific terms used herein shall have the ordinary meaning as understood by one of ordinary skill in the art to which the present disclosure belongs. The terms "first". "second", and the like used in the present disclosure are not intended to indicate any order, quantity, or importance, but rather are used for distinguishing one element from another. The term of "comprising", "including". or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper/on/above", "lower/under/below", "left", "right", and the like are used only for indicating relative positional relationships, and when the absolute position of an object being described is changed, the relative positional relationships may be changed accordingly.

Figure 1:
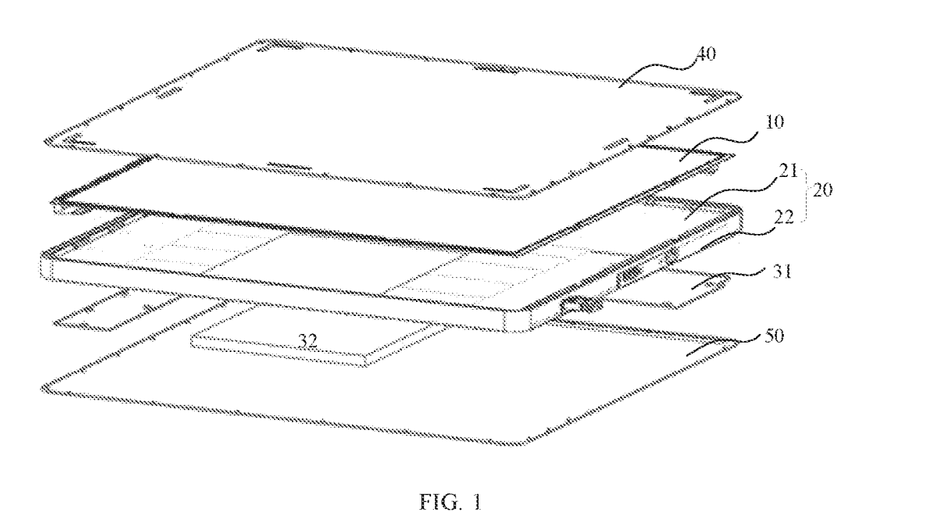
FIG. 1 is a schematic diagram of a flat panel detector provided in an example.

FIG. 1 is a schematic diagram of a flat panel detector provided in an example. As shown in FIG. 1, the flat panel detector includes: a bottom plate 50, an electronic device, a middle frame 20, a detection substrate 10, and a cover plate 40. The middle frame 20 includes a bearing plate 21 and a frame 22 surrounding the bearing plate 21, the bearing plate 21 and the bottom plate 50 are arranged opposite to each other, and the frame 22 is connected to the bottom plate 50, thereby defining a first accommodating space among the frame 22, the bearing plate 21 and the bottom plate 50 (i.e., the frame 22, the bearing plate 21 and the bottom plate 50 together define a first accommodating space); the frame 22 is connected to the cover plate 40, thereby defining a second accommodating space among the frame 22, the bearing plate 21 and the cover plate 40.

In some implementations, the detection substrate 10 is located in the second accommodating space and the electronic device is located in the first accommodating space. The electronic device includes a driving circuit board 31 and a battery 32, etc., the driving circuit board 31 is located in the first accommodating space, and the detection substrate 10 is connected to the driving circuit board 31 through a flexible circuit board (not shown) that passes through the bearing plate 21.

Figure 2:
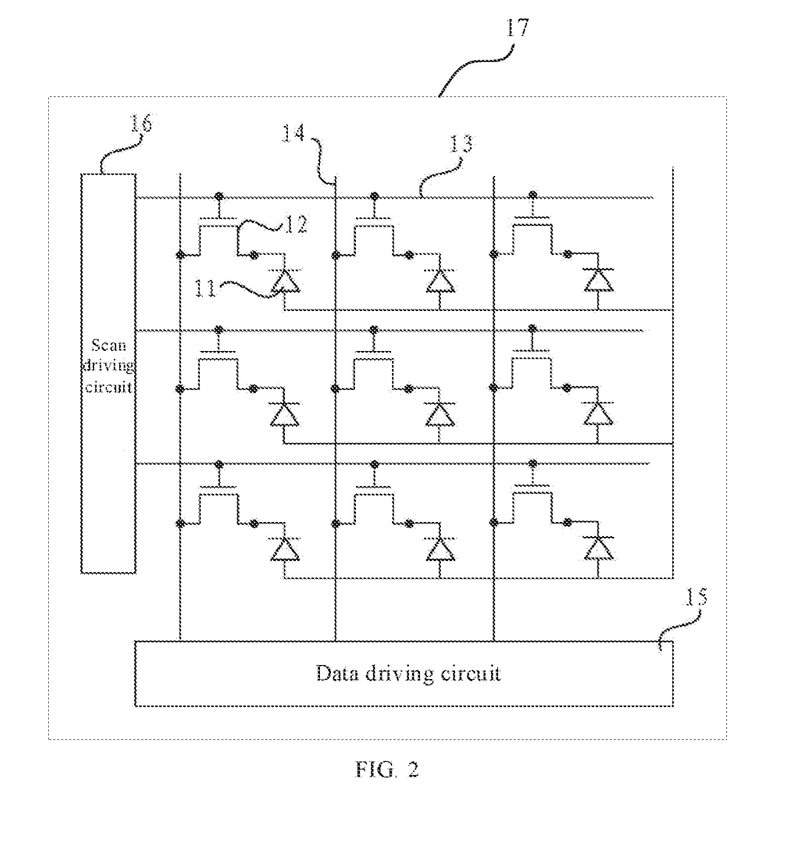
FIG. 2 is a schematic diagram of a detection substrate in an example.

FIG. 2 is a schematic diagram of a detection substrate in an example. As shown in FIG. 2, the detection substrate 10 includes a base substrate, a plurality of scan lines 13 and a plurality of data lines 14 disposed on the base substrate, the plurality of scan lines 13 intersect the plurality of data lines 14 to define a plurality of photosensitive regions, each photosensitive region is provided with a photodiode 11 and a thin film transistor 12 therein, a gate electrode of the thin film transistor 12 is connected to the corresponding scan line 13, a drain electrode of the thin film transistor 12 is connected to the corresponding data line 14, a source electrode of the thin film transistor 12 is connected to the photodiode, an end of each data line 14 is connected to a data driving circuit 15, and an end of each scan line 13 is connected to a scan driving circuit 16. The flexible circuit board may be connected to the scan driving circuit and the data driving circuit, so as to transmit a control signal of the driving circuit board 31 to the scan driving circuit 16 and receive an electrical signal read by the data driving circuit 15.

An X-ray conversion layer is provided on a side of photodiodes 11 and thin film transistors 12 away from the base substrate 17. The operation principle of the detection substrate 10 is as follows: during X-rays being irradiated to the detection substrate 10. the X-ray conversion layer converts the X-rays into visible light, and the photodiode 11 converts the visible light into an electrical signal and stores the electrical signal therein. Under the control of the driving circuit board 31, the scan driving circuit 16 provides scan signals for the scan lines 13 row by row, to drive the thin film transistors 12 to be turned on row by row. During the thin film transistors 12 being turned on, electrical signals converted by the photodiodes 11 are transmitted to the data lines 14 through the thin film transistors 12 and transmitted to the data driving circuit 15 through the data lines 14, the data driving circuit 15 sends the electrical signals read to the driving circuit board 31, the driving circuit board 31 performs further processes including amplification, analog-to-digital conversion and the like on the electrical signals, thereby obtaining an amount of X-rays received by each photosensitive region, and further determining image information.

The X-ray conversion layer may be a cesium iodide (CSI) scintillator layer, which has a relatively low radiation dose and generates a relatively large amount of photoelectrons, so that the detection sensitivity can be improved, and the final generated image is clearer.

For assembling the flat panel detector shown in FIG. 1, the bottom plate 50 and the middle frame 20 are to be fixed together, and the flexible circuit board is desired to pass through the bearing plate 21, which results in relatively low assembly efficiency.

Figure 3:
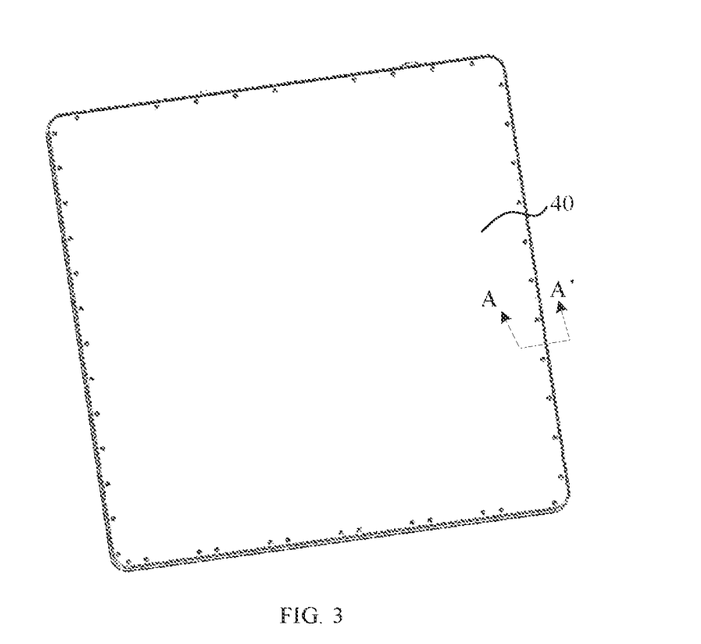
FIG. 3 is a schematic diagram of an overall structure of a flat panel detector provided in the present disclosure.
Figure 4:
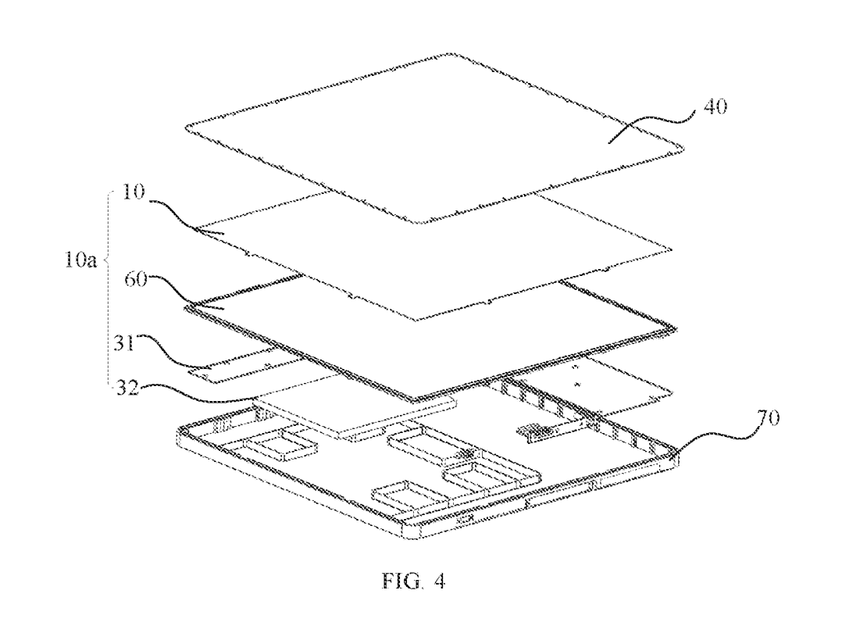
FIG. 4 is an exploded view of a flat panel detector provided in the present disclosure.
Figure 5:
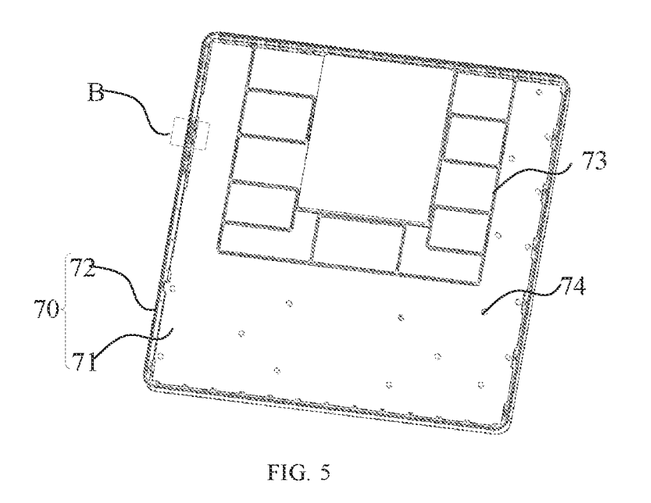
FIG. 5 is a schematic diagram of a main housing provided in the present disclosure.
Figure 6:
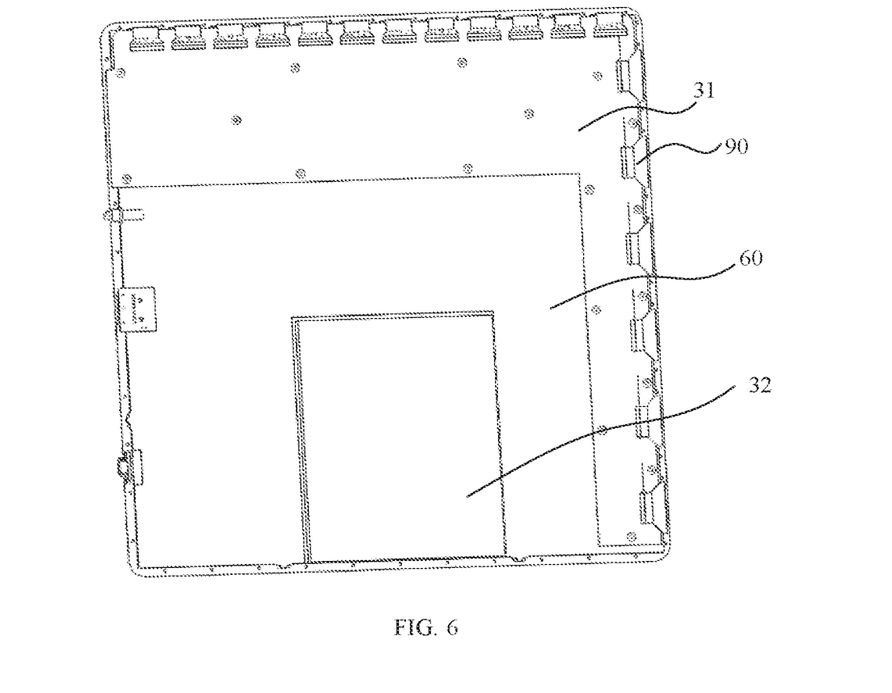
FIG. 6 is a rear view of a detection module provided in the present disclosure.

FIG. 3 is a schematic diagram of an overall structure of a flat panel detector provided in the present disclosure. FIG. 4 is an exploded view of a flat panel detector provided in the present disclosure. As shown in FIGS. 3 and 4, the flat panel detector includes: a main housing 70 and a detection module 10a. FIG. 5 is a schematic diagram of a main housing provided in the present disclosure. FIG. 6 is a rear view of a detection module provided in the present disclosure. As shown in FIG. 5, the main housing 70 has a bottom wall 71 and a side wall 72 connected to the bottom wall 71, and the bottom wall 71 and the side wall 72 define an accommodating space.

The detection module 10a is disposed in the accommodating space, and as shown in FIGS. 4 and 6, the detection module 10a includes: a support plate 60, the detection substrate 10, the driving circuit board 31, and a flexible circuit board 90.

In some implementations, the support plate 60 is of a plate-like structure having support and bottom surfaces opposite to each other and a side surface connected therebetween. The detection substrate 10 is fixed on the support surface; the driving circuit board 31 is fixed on the support plate 60 and is located on a side of the support plate 60 away from the detection substrate 10. The flexible circuit board 90 connects the detection substrate 10 with the driving circuit board 31 by passing the side surface of the support plate.

In an example, a specific structure of the detection substrate 10 is the same as that shown in FIG. 2, and the principle of the detection substrate 10 for an X-ray detection is described above and will not be described herein again.

In the flat panel detector shown in FIG. 4, the flexible printed circuit 90 directly bypasses the support plate 60 to connect the detection substrate 10 with the driving circuit board 31, which facilitates the assembly of the flat panel detector and improves the assembly efficiency.

In some implementations, the bottom wall 71 and the side wall 72 of the main housing 70 are connected into one piece (i.e., are of an integrated structure), so as to improve the overall strength of the main housing 70, and the bottom wall 71 and the side wall 72 are not to be assembled together, thereby further improving the assembly efficiency of the flat panel detector. The main housing 70 may be formed by machining the base substrate through a one-piece forming (integral forming) process, such as, a milling process. The bottom wall 71 of the main housing 70 may be connected to the bottom of the side wall 72, so that only single-sided processing for the base substrate is to be performed in the integral forming process, thereby improving the process efficiency and reducing the processing cost.

The main housing 70 may be made of a material having a relatively low density. thereby reducing the overall weight of the flat panel detector. For example, the main housing 70 may be made of an aluminum alloy.

As shown in FIG. 5, a reinforcing rib 73 is provided on the bottom wall 71 of the main housing 70, to further enhance the overall strength of the main housing 70. In some implementations, the reinforcing rib 73 and the bottom wall 71 are formed into one piece (i.e., are of an integrated structure).

In some implementations, the reinforcing rib 73 is provided on a side of the bottom wall 71 facing the support plate 60, which cannot affect the overall appearance of the flat panel detector; and the reinforcing rib 73 can support the support plate 60, which can improve the stability of the structure.

Figure 7:
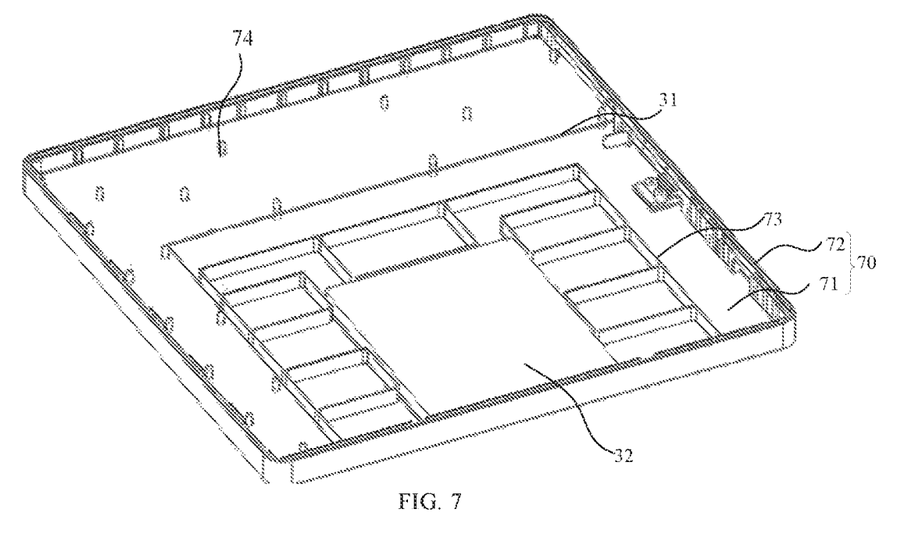
FIG. 7 is a schematic diagram of a driving circuit board and a battery disposed in a main housing provided in the present disclosure.

FIG. 7 is a schematic diagram of a driving circuit board and a battery disposed in a main housing provided in the present disclosure. As shown in FIG. 7, an orthographic projection of the reinforcing rib 73 on the bottom wall 71 does not overlap with an orthographic projection of the driving circuit board 31 on the bottom wall 71.

In addition, as shown in FIGS. 4 and 6, the detection module 10a may further include a battery 32 connected to the driving circuit board 31 to supply power to the driving circuit board 31. As shown in FIG. 7, an orthographic projection of the battery 32 on the bottom wall 71 and the orthographic projection of the reinforcing rib 73 on the bottom wall 71 do not overlap with each other. In an example, as shown in FIG. 7, the reinforcing rib 73 may include a plurality of rectangular frames located around the battery 32.

The battery 32 may be adhered to the back of the support plate 60 by adhesive.

As shown in FIG. 5, a plurality of support pillars 74 are further disposed on the bottom wall 71 of the main housing 70, and can support the driving circuit board 31, and each support pillar 74 may cooperate with a corresponding fastening assembly to fixedly connect the support plate 60, the driving circuit board 31 and the bottom wall 71 of the main housing 70 together.

Figure 8:
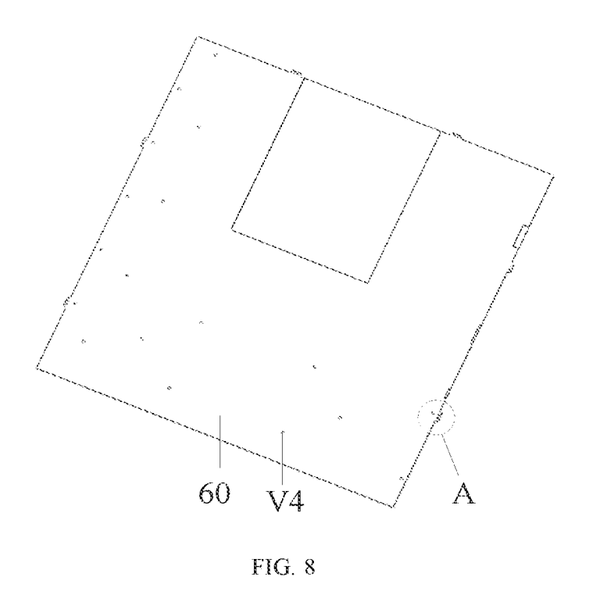
FIG. 8 is a perspective view of a support plate provided in the present disclosure.
Figure 9:
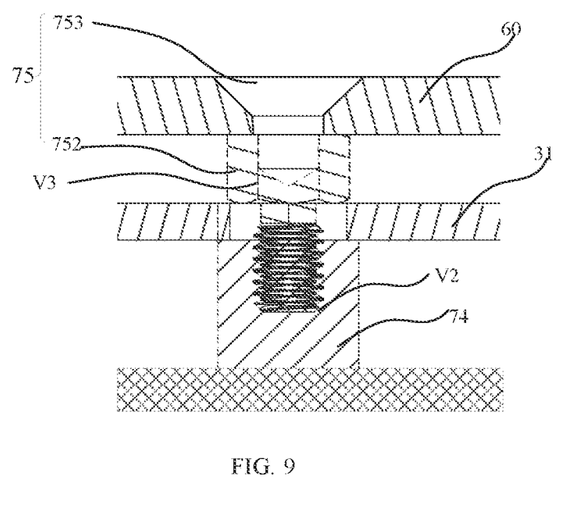
FIG. 9 is a schematic diagram showing a connection among a support plate, a driving circuit board and a bottom wall of a main housing provided in the present disclosure.

FIG. 8 is a perspective view of a support plate provided in the present disclosure. FIG. 9 is a schematic diagram showing a connection among a support plate, a driving circuit board and a bottom wall of a main housing provided in the present disclosure. As shown in FIGS. 8 and 9, a second fixing hole V2 is provided in each support pillar 74, the driving circuit board 31 is supported on the support pillars 74, and fastening assemblies 75 are in one-to-one correspondence with the support pillars 74 and pass through the driving circuit board 31. Each fastening assembly 75 has an end fixed to the support plate 60 and another end fixed in the second fixing hole V2 corresponding thereto.

In some implementations, as shown in FIG. 9, each fastening assembly 75 includes: a second fastening member 752 and a third fastening member 753, a part of the second fastening member 752 is positioned between the support plate 60 and the driving circuit board 31, and another part of the second fastening member 752 passes through the driving circuit board 31 and is fixed in the second fixing hole V2; the second fastening member 752 is provided with a third fixing hole V3 therein. The third fastening member 753 has an end fixed to the support plate 60 and another end fixed in the third fixing hole V3 corresponding thereto.

As shown in FIGS. 8 and 9, the support plate 60 is provided with a fourth fixing hole V4 therein, and an end of the third fastening member 753 is fixed in the fourth fixing hole V4. In some implementations, a distance from the end of the third fastening member 753 away from the bottom wall 71 to the bottom wall 71 is smaller than or equal to a distance from the support surface of the support plate 60 to the bottom wall 71, that is, the third fastening member 753 does not go beyond the upper end of the fourth fixing hole V4, thereby ensuring flatness of the support surface.

As shown in FIG. 8, the support plate 60 is provided with a plurality of the fourth fixing holes V4 therein, each support pillar 74 and the fastening assembly 75 corresponding thereto correspond to one fourth fixing hole V4

In an example, each support pillar 74 is a threaded stud with a threaded hole; the second fastening member 752 may be a countersunk head screw, the third fastening member 753 may be a single head hexagon bolt, a head of the single head hexagon bolt is positioned between the support plate 60 and the driving circuit board 31, and the third fixing hole V3 is a threaded hole provided at the head of the single head hexagon bolt. A head of the countersunk head screw is positioned in the fourth fixing hole V4 in the support plate 60, a rod part of the countersunk head screw is in threaded connection with the threaded hole on the single head hexagon bolt, and a screw rod of the single head hexagon bolt passes through the driving circuit board 31 to be in threaded connection with the threaded hole in the support pillar 74.

In practical applications, heights of the reinforcing rib 73 and the support pillars 74 may be set according to a thickness of the driving circuit board 31 and a distance between the driving circuit board 31 and the support plate 60, so that a portion of the support plate 60 not covered by the driving circuit board 31 is supported on the reinforcing rib 73, and the driving circuit board 31 is supported on the support pillars 74, thereby improving the fixing stability of the support plate 60 and the driving circuit board 31.

Figure 10:
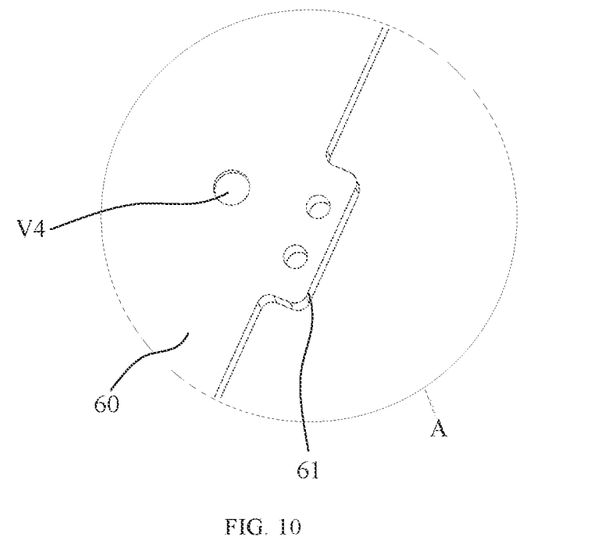
FIG. 10 is an enlarged view of a region A in FIG. 8.
Figure 11:
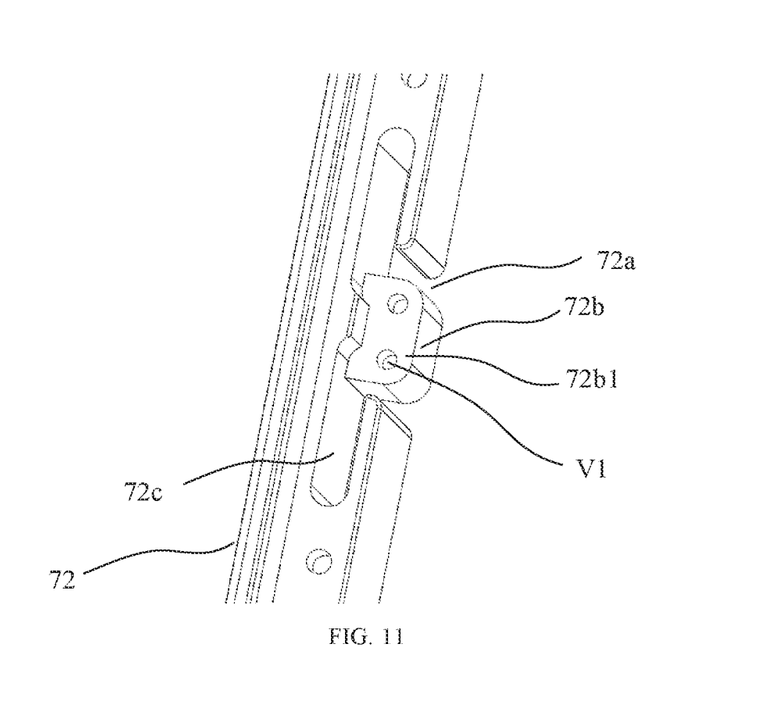
FIG. 11 is an enlarged view of a region B in FIG. 5.

FIG. 10 is an enlarged view of a region A in FIG. 8. FIG. 11 is an enlarged view of a region B in FIG. 5. As shown in FIG. 9, a lug 61 is provided at an edge of the support plate 60, the lug 61 protrudes toward a direction away from a middle portion of the support plate 60, and the support plate 60 and the lug 61 may be formed into one piece (i.e., an integrated structure). A limiting groove 72a is provided in the side wall 72 of the main housing 70, and at least a portion of the lug 61 extends into the limiting groove 72a. The lug 61 and the limiting groove 72a cooperate with each other to limit the position of the support plate 60, and during assembling the flat panel detector, the lug 61 and the limiting groove 72a may be used as a fool-proof structure to prevent the support plate 60 from being placed inversely, so that the assembling efficiency is improved.

As shown in FIG. 11, a boss 72b is provided in the limiting groove 72a, the boss 72b has a fixing surface 72b1 away from the bottom wall 71, and the lug 61 is fixed on the fixing surface 72b1. The boss 72b may support the support plate 60, so that the bottom wall 71 of the main housing 70 may be prevented from being pressed against the driving circuit board 31.

Figure 12:
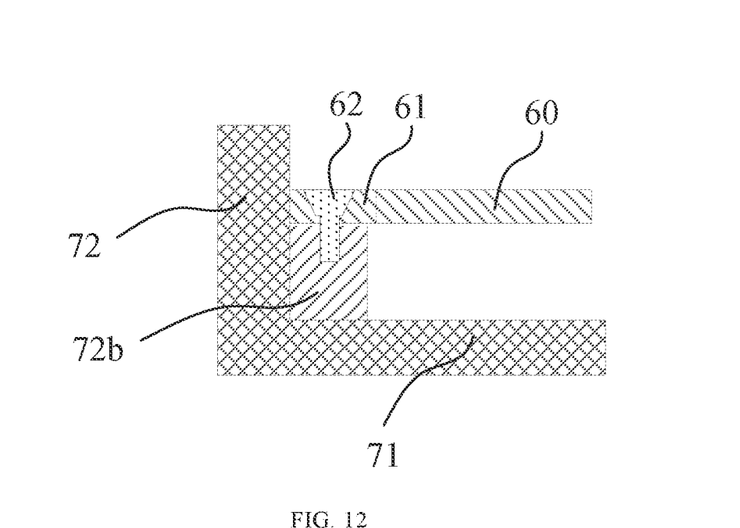
FIG. 12 is a cross-sectional view of a lug secured to a boss provided in the present disclosure.

FIG. 12 is a cross-sectional view of a lug secured to a boss provided in the present disclosure. As shown in FIGS. 11 and 12, the boss 72b is provided with a first fixing hole V1 therein, and the flat panel detector further includes a first fastening member 62, the first fastening member 62 has an end disposed on the lug 61, and another end fixed in the first fixing hole V1, so as to fix the lug 61 on the fixing surface 72b1.

In some implementations, the lug 61 is provided with a second fixing hole V2 therein, and an end of the first fastening member 62 is fixed in the second fixing hole V2. In some implementations, a distance from the end of the first fastening member 62 away from the bottom wall 71 to the bottom wall 71 is not greater than a distance from a surface of the lug 61 away from the bottom wall 71 to the bottom wall 71, so as to ensure the flatness of surface of the lug 61.

In an example, the first fastening member 62 is a countersunk head bolt, the first fixing hole V1 is a screw hole, a head of the first fastening member 62 is inserted into the second fixing hole V2, and a rod part of the first fastening member 62 is in threaded connection with the first fixing hole V1.

In some implementations, a plurality of lugs 61 may be disposed on the support plate 60, a plurality of limiting grooves 72a may be disposed in the side wall 72, and the plurality of lugs 61 are in one-to-one correspondence with the plurality of limiting grooves 72a. For example, the side wall 72 of the main housing 70 includes a plurality of sides connected sequentially for enclosing a frame shape, the battery 32 is in contact with one of the sides; the limiting groove 72a may be provided on each of the sides except for the side in contact with the battery 32.

A height of the boss 72b may be the same as a height of the reinforcing rib 73, so that in response to a part of the support plate 60 being supported on the reinforcing rib 73 and the lug 61 being supported on the boss 72b, the support surface of the support plate 60 is a flat surface, which is advantageous for fixing the detection substrate 10.

In an example, the detection substrate 10 may be fixed on the support surface by using an adhesive, which is advantageous for the flatness of the fixing of the detection device and is convenient for assembly. Alternatively, other fixing manners may be adopted to fix the detection substrate 10.

In some implementations, as shown in FIG. 11, the side wall 72 of the main housing 70 is further provided with a groove 72c therein, and an opening of the groove 72c is located on an end surface of the side wall 72 away from the bottom wall 71, the groove 72c may penetrate through the side wall 72 along a height direction of the side wall 72. By providing the groove 72c in the side wall 72, a reduced weight can be obtained, and the opening of the groove 72c is located on the end surface of the side wall 72 away from the bottom wall 71, so as to reduce the influence of the groove 72c on the support ability of the side wall 72.

A plurality of grooves 72c may be provided in the side wall 72, and may be uniformly distributed on the plurality of sides of the side wall 72, and as shown in FIG. 11, the groove 72c may be communicated with the limiting groove 72a. Alternatively, the groove 72c and the limiting groove 72a may also be disposed at different positions. which is not limited in embodiments of the present disclosure.

In addition, a shape of the groove 72c is not limited in the embodiments of the present disclosure. For example, the groove 72c may have a cylinder shape with a circular, oval, rectangular or any other irregular cross-section.

Figure 13:
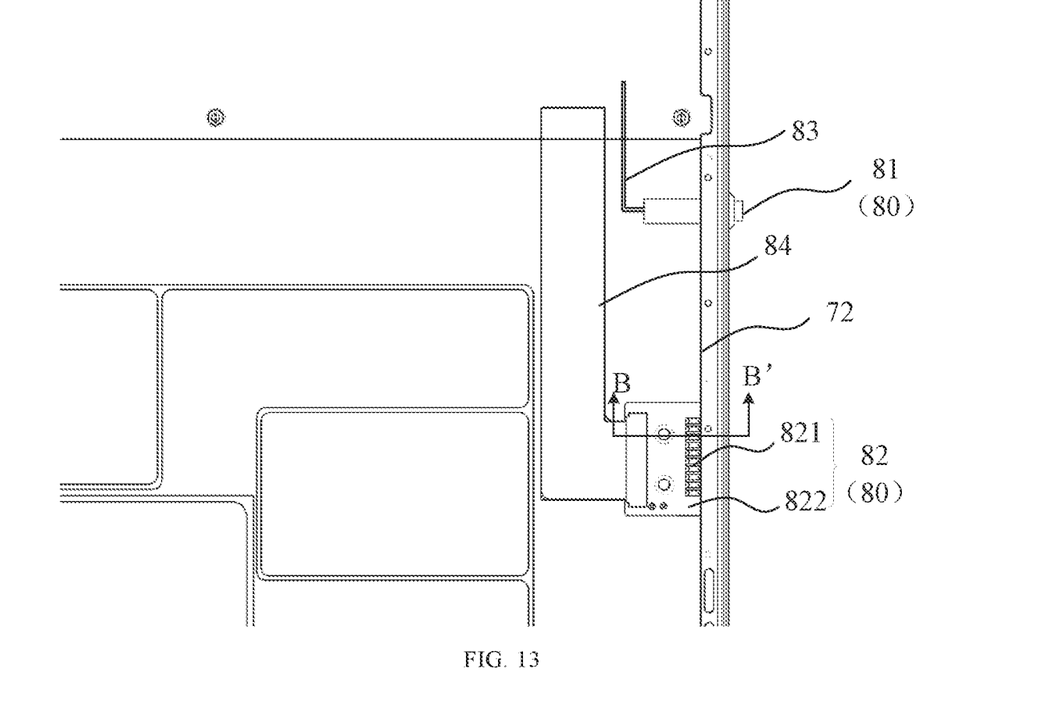
FIG. 13 is a top view showing a connection between an auxiliary functional element and a driving circuit board provided in the present disclosure.

In some implementations, the flat panel detector further includes an auxiliary functional element 80. FIG. 13 is a top view showing a connection between an auxiliary functional element and a driving circuit board provided in the present disclosure. At least a portion of the auxiliary functional element 80 is fixed in an accommodating cavity, and the auxiliary functional element 80 is electrically connected to the driving circuit board 31, so as to realize signal transmission between the auxiliary functional element 80 and the driving circuit board 31. The side wall 72 is provided with an open pore 72v therein, and the auxiliary functional element 80 is disposed opposite to the open pore 72v.

A plurality of auxiliary functional elements 80 may be provided to be in one-to-one correspondence with open pores 72v. As shown in FIG. 13, in some examples, the plurality of auxiliary functional elements 80 include a button 81 connected to the driving circuit board 31 through a first conductive member 83, so as to provide a switching signal to the driving circuit board 31, to control the flat panel detector to be turned on or off. The button 81 may be disposed on the side wall 72 of the main housing 70, and a portion of the button 81 may be exposed out through the open pore 72v corresponding thereto. The open pore 72v corresponding to the button 81 may have a shape matching that of the button.

In some examples, the plurality of auxiliary functional elements 80 further include a light emitting assembly 82 connected to the driving circuit board 31 through a second conductive member 84, and the light emitting assembly 82 can emit light or extinguish the light under the driving of the driving circuit board 31, thereby indicating an operation state of the flat panel detector.

Figure 14:
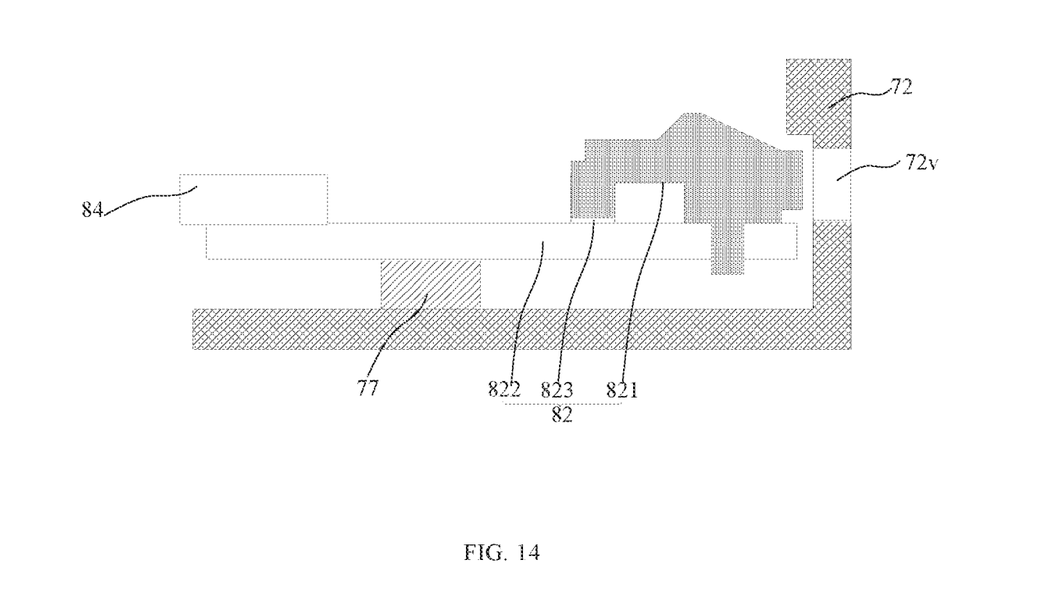
FIG. 14 is a cross-sectional view taken along a line B-B' of FIG. 13.

FIG. 14 is a cross-sectional view taken along a line B-B' of FIG. 13. As shown in FIG. 14, the light emitting assembly 82 includes: a lamp plate 822, a light emitting member 823 and a light guide member 821 on the lamp plate 822. The lamp plate 822 is electrically connected to the driving circuit board 31 through the second conductive member 84. The light emitting member 823 may be, for example, a light emitting diode, and is connected to the driving circuit board 31 through traces on the lamp plate 822, so as to emit light or extinguish the light under the driving of the driving circuit board 31. A fixing portion may be provided on the light guide member 821, and the fixing portion is fixed in a through hole in the lamp plate 822, so that the light guide member 821 is fixed on the lamp plate 822. The light emitting member 823 emits light toward the light guide member 821, and the light is reflected multiple times in the light guide member 821, and is emitted out of the light guide member 821 toward the open pore 72v in the side wall 72. The shape of the open pore 72v corresponding to the light guide member 821 is not limited, as long as light can transmit through the open pore 72v. For example, the open pore 72v corresponding to the light guide member 821 may be circular, square, or have any other irregular shape.

In some implementations, a threaded stud 77 is provided at a position, corresponding to the lamp plate 822, on the bottom wall 71 of the main housing 70, the lamp plate 822 is supported on the threaded stud, a screw may be provided on the lamp plate 822 to be in threaded connection with a screw hole in the threaded stud 77, for fixing the lamp plate 822.

As shown in FIGS. 3 and 4, the flat panel detector further includes a cover plate 40 on a side of the detection module 10a away from the bottom wall 71 of the main housing 70 and connected to the side wall 72 of the main housing 70. In some implementations, the cover plate 40 may be connected to the side wall 72 by a fastening member such as screws, which is convenient for assembly, and is convenient for later disassembly for maintenance, inspection and testing.

The cover plate 40 may be made of aluminum alloy or other material with a relatively low density, so as to reduce the overall weight of the flat panel detector. In addition, in some examples, an oxide film and a protective paint may be coated on outside of the cover plate 40 and outside of the main housing 70, which can prevent acid gas/liquid and alkali gas/liquid in an industrial field from corroding the flat panel detector.

Figure 15:
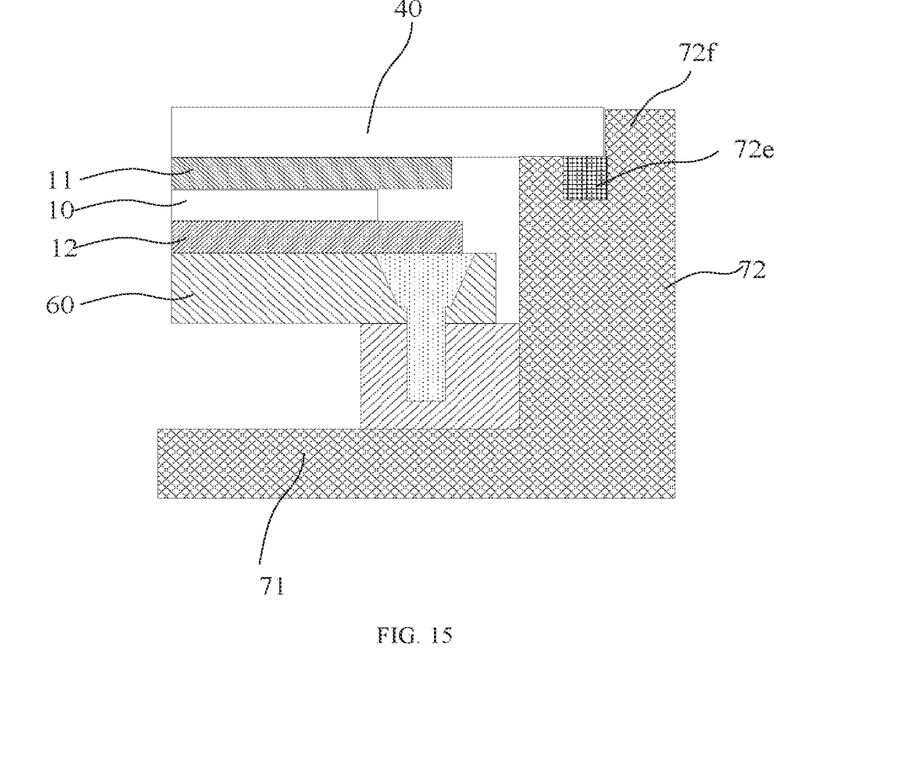
FIG. 15 is a cross-sectional view taken along a line A-A' of FIG. 3.

FIG. 15 is a cross-sectional view taken along a line A-A of FIG. 3. As shown in FIG. 15, an accommodating groove is further provided in a top end of the side wall 72 of the main housing 70 (i.e., an end of the side wall 72 away from the bottom wall 71) and surrounds the accommodating space, and a sealing ring 72e is disposed in the accommodating groove. The sealing ring 72e may be a flexible structure such as a rubber ring. By providing the sealing ring 72e, external aqueous vapor can be prevented from getting into the flat panel detector, and thus, the flat panel detector can be prevented from being corroded. During the sealing ring 72e being not extruded, a height of the sealing ring 72e may be slightly greater than a depth of the accommodating groove 72e, so that after the cover plate 40 is connected to the side wall 72, the cover plate 40 can be tightly attached to the sealing ring 72e, and the sealing effect is ensured.

A retaining wall 72f may be further provided on the top end of the side wall 72, and surround the sealing ring 72e. After the cover plate 40 is connected to the side wall 72, the retaining wall 72f surrounds the cover plate 40, so as to improve the sealing performance of the flat panel detector. The retaining wall 72f and the side wall 72 may be formed into one piece (i.e., an integrated structure).

As shown in FIG. 15, the detection substrate 10 may be adhered to the cover plate 40 through a first adhesive layer 11, and adhered to the support plate 60 through a second adhesive layer 12, and the first adhesive layer 11 and the second adhesive layer 12 each may be a foam double-sided adhesive, so that a certain buffering effect can be provided during the adhesive effect being achieved, and the detection substrate 10 is prevented from being damaged.

An assembly process for the flat panel detector in the embodiments of the present disclosure may include as follows. The detection substrate 10 is electrically connected with the driving circuit board 31 by using the flexible circuit board, and then all the detection substrate 10, the driving circuit board 31 and the battery 32 are fixed on the support plate 60, the detection substrate 10 is fixed on the support surface of the support plate, and the driving circuit board 31 and the battery 32 are both located on a side of the support plate 60 away from the detection substrate 10. The driving circuit board 31 is electrically connected to the button 81 by the first conductive member 83, the light emitting assembly 82 is electrically connected to the driving circuit board 31 by the second conductive member 84, and the button 81 and the light emitting assembly 82 are fixed on the main housing 70. Then, the support plate 60 provided with the detection device, the driving circuit board 31 and the battery 32 is fixed on the main housing 70. Finally, the cover plate 40 is fixedly connected to the main housing 70.

The embodiments of the present disclosure further provides an imaging system. which includes the flat panel detector in the above embodiments.

The imaging system may further include an imaging module electrically connected to the flat panel detector and configured to perform an imaging operation according to signals output by the flat panel detector. In addition, the imaging system may further include an X-ray source.

As can be seen from the above description for the flat panel detector and the imaging system in the embodiments of the present disclosure, in the flat panel detector in the embodiments of the present disclosure, during the flexible circuit board connecting the detection substrate with the driving circuit board, the flexible circuit board directly bypasses the edge of the support board, rather than penetrating through the support board, thereby improving the assembly efficiency and the maintenance efficiency. The main housing is formed into one piece (i.e., is of an integrated structure), and thus, has a better structural stability, and the side wall of the main housing, the reinforcing rib, the support pillars are all provided on a same side of the bottom side. In this way, during the production and processing, only the single-sided processing is to be performed, which improves the production efficiency and reduces the production cost. The lug on the support plate cooperates with the limiting groove in the side wall, so as to improve the mounting precision. The connections between the cover plate and the main housing, between the support plate and the driving circuit board and between the driving circuit board and the main housing each are realized in a detachable connection mode, for example, through screws, so that the product is easy to be assembled, and is easy to be disassembled later for inspection, maintenance, and testing.

It should be understood that the above embodiments are merely exemplary embodiments adopted to explain the principles of the present disclosure, and the present disclosure is not limited thereto. It will be apparent to one of ordinary skill in the art that various changes and modifications may be made without departing from the spirit and scope of the present disclosure, and such changes and modifications also fall within the scope of the present disclosure.

What is claimed is:

1. A flat panel detector, comprising:
a main housing comprising a bottom wall and a side wall connected to the bottom wall, the bottom wall and the side wall defining an accommodating space; and
a detection module in the accommodating space, wherein the detection module comprises a support plate, a detection substrate, a driving circuit board, and a flexible circuit board,
the support plate comprises a support surface and a bottom surface opposite to each other and a side surface connected between the support surface and the bottom surface,
the detection substrate is fixed on the support surface;
the driving circuit board is fixed on the support plate and is on a side of the support plate away from the detection substrate, and
the detection substrate and the driving circuit board are connected by the flexible circuit board passing the side surface of the support plate,
wherein a lug is provided at an edge of the support plate, a limiting groove is provided in the side wall of the main housing, and at least a portion of the lug is in the limiting groove.

2. The flat panel detector according to claim 1, wherein a boss is provided in the limiting groove, and comprises a fixing surface away from the bottom wall, and the lug is fixed on the fixing surface.

3. The flat panel detector according to claim 2, wherein a first fixing hole is provided in the boss; the flat panel detector further comprises a first fastening member, an end of the first fastening member is arranged on the lug, and another end of the first fastening member is fixed in the first fixing hole, so as to fix the lug on the fixing surface.

4. The flat panel detector according to claim 1, wherein a support pillar is provided on the bottom wall, the driving circuit board is supported on the support pillar, and a second fixing hole is provided in the support pillar;
the flat panel detector further comprises a fastening assembly passing through the driving circuit board, an end of the fastening assembly is arranged on the support plate, and another end of the fastening assembly is fixed in the second fixing hole.

5. The flat panel detector according to claim 4, wherein the fastening assembly comprises:
a second fastening member, a part of the second fastening member being between the support plate and the driving circuit board, another part of the second fastening member passing through the driving circuit board and being fixed in the second fixing hole, and a third fixing hole being provided in the second fastening member; and
a third fastening member, an end of the third fastening member being fixed on the support plate, and another end of the third fastening member being fixed in the third fixing hole.

6. The flat panel detector according to claim 5, wherein a fourth fixing hole is provided in the support plate, and an end of the third fastening member is fixed in the fourth fixing hole.

7. The flat panel detector according to claim 1, wherein the detection module further comprises: a battery fixed on a back surface of the support plate and electrically connected to the driving circuit board.

8. The flat panel detector according to claim 7, wherein a reinforcing rib is provided on a surface of the bottom wall facing the accommodating space, and an orthographic projection of the reinforcing rib on the bottom wall does not overlap with an orthographic projection of the battery on the bottom wall.

9. The flat panel detector according to claim 8, wherein the reinforcing rib includes a plurality of rectangular frames located around the battery.

10. The flat panel detector according to claim 1, further comprising: an auxiliary functional element, wherein at least a part of the auxiliary functional element is fixed in the accommodating space and electrically connected to the driving circuit board; an open pore is provided in the side wall, and the auxiliary functional element corresponds to the open pore in position.

11. The flat panel detector according to claim 10, wherein the auxiliary functional element includes a light emitting assembly connected to the driving circuit board, the light emitting assembly includes a lamp plate, a light emitting member and a light guide member, the lamp plate is electrically connected to the driving circuit board, and the light emitting member is connected to the driving circuit board through the lamp plate, and the light guide member is fixed on the lamp plate.

12. The flat panel detector according to claim 1, further comprising: a cover plate on a side of the detection module away from the bottom wall of the main housing and connected to the side wall of the main housing.

13. The flat panel detector according to claim 1, wherein an accommodating groove is provided in an end of the side wall away from the bottom wall, and surrounds the accommodating space, and a sealing ring is provided in the accommodating groove.

14. The flat panel detector according to claim 13, wherein a retaining wall surrounding the sealing ring is provided on a top end of the side wall, and the retaining wall and the side wall are of an integrated structure.

15. The flat panel detector according to claim 14, further comprising:
a cover plate on a side of the detection module away from the bottom wall of the main housing,
wherein the cover plate is connected to the side wall of the main housing so that the cover plate is surrounded by the retaining wall.

16. The flat panel detector according to claim 1, wherein a plurality of grooves are disposed in the side wall, and openings of the plurality of grooves are in an end surface of the side wall away from the bottom wall,
wherein each groove penetrates through the side wall along a height direction of the side wall.

17. The flat panel detector according to claim 1, wherein the bottom wall and the side wall of the main housing are of an integrated structure.

18. An imaging system, comprising the flat panel detector of claim 1.

19. A flat panel detector, comprising:
a main housing comprising a bottom wall and a side wall connected to the bottom wall, the bottom wall and the side wall defining an accommodating space; and
a detection module in the accommodating space, wherein the detection module comprises a support plate, a detection substrate, a driving circuit board, and a flexible circuit board,
the support plate comprises a support surface and a bottom surface opposite to each other and a side surface connected between the support surface and the bottom surface,
the detection substrate is fixed on the support surface;
the driving circuit board is fixed on the support plate and is on a side of the support plate away from the detection substrate, and
the detection substrate and the driving circuit board are connected by the flexible circuit board passing the side surface of the support plate,
wherein a support pillar is provided on the bottom wall, the driving circuit board is supported on the support pillar, and a second fixing hole is provided in the support pillar;
the flat panel detector further comprises a fastening assembly passing through the driving circuit board, an end of the fastening assembly is arranged on the support plate, and another end of the fastening assembly is fixed in the second fixing hole.

20. A flat panel detector, comprising:
a main housing comprising a bottom wall and a side wall connected to the bottom wall, the bottom wall and the side wall defining an accommodating space; and
a detection module in the accommodating space, wherein the detection module comprises a support plate, a detection substrate, a driving circuit board, and a flexible circuit board,
the support plate comprises a support surface and a bottom surface opposite to each other and a side surface connected between the support surface and the bottom surface,
the detection substrate is fixed on the support surface;
the driving circuit board is fixed on the support plate and is on a side of the support plate away from the detection substrate, and
the detection substrate and the driving circuit board are connected by the flexible circuit board passing the side surface of the support plate,
wherein the detection module further comprises: a battery fixed on a back surface of the support plate and electrically connected to the driving circuit board,
wherein a reinforcing rib is provided on a surface of the bottom wall facing the accommodating space, and an orthographic projection of the reinforcing rib on the bottom wall does not overlap with an orthographic projection of the battery on the bottom wall.

* * * * *